(12) United States Patent
Lin et al.

(10) Patent No.: US 7,221,194 B2
(45) Date of Patent: May 22, 2007

(54) ANALOG BUFFERS COMPOSED OF THIN FILM TRANSISTORS

(75) Inventors: Ching-Wei Lin, Taoyuan (TW); Chueh-Kuei Jan, Taipei (TW); Meng-Hsun Hsieh, Taichung (TW)

(73) Assignee: TPO Displays Corp., Chu-Nan (TW)

( * ) Notice: Subject to any disclaimer, the term of this patent is extended or adjusted under 35 U.S.C. 154(b) by 141 days.

(21) Appl. No.: 11/061,836

(22) Filed: Feb. 18, 2005

(65) Prior Publication Data
US 2006/0186932 A1    Aug. 24, 2006

(51) Int. Cl.
*H03K 3/00* (2006.01)
(52) U.S. Cl. ...................... 327/108; 345/204
(58) Field of Classification Search ............... 327/108; 345/204
See application file for complete search history.

(56) References Cited

U.S. PATENT DOCUMENTS 6,556,162 B2   4/2003  Brownlow et al. ......... 341/145
6,876,235 B2*  4/2005  Li et al. ..................... 327/112
6,919,743 B2*  7/2005  Tobita ........................ 327/108
7,075,342 B2*  7/2006  Nishimura ................. 327/108

OTHER PUBLICATIONS

Y. Kida, et al., "LN-4: A 3.8 inch Half-VGA Transflective Color TFT-LCD with Completely Integrated 6-bit RGB Parallel Interface Drivers", EURODISPLAY 2002, pp. 831-834.

* cited by examiner

*Primary Examiner*—Kenneth B. Wells
(74) *Attorney, Agent, or Firm*—Liu & Liu

(57) ABSTRACT

Analog buffers with a precise gate to source voltage compensation and a small DC offset, by storing an input offset voltage to be used as an output offset voltage to reverse the offset in the input. A first source follower at the input end and a second source follower at the output end are both coupled to a switching circuit, wherein the first follower provides an input offset voltage (e.g., |Vgsp|) based on the input voltage (Vin), the second source follower provides an output voltage (Vout) by compensating Vin transmitted through the analog buffer circuit with an output offset voltage (|Vgsn|), and the switching circuit stores and equalizes the output offset voltage to the input offset voltage (|Vgsp|=|Vgsn|), so to obtain an output Vout that is identical to Vin.

21 Claims, 16 Drawing Sheets

US 7,221,194 B2

ANALOG BUFFERS COMPOSED OF THIN FILM TRANSISTORS

BACKGROUND

The invention relates to analog buffers, and more particularly, to unit-gain analog buffers with a precise gate to source voltage ($V_{gs}$) compensation and a small DC offset.

In conventional display systems, digital-to-analog conversion (DAC) is the most important part of a driving circuit. Typically, a digital-to-analog converter requires a unit-gain analog buffer to improve the driving performance thereof. In normal integrated circuits (ICs) designs, analog buffer typically comprises operational amplifiers, as shown in FIG. 1. However, it requires a large chip area.

To reduce total module costs, the "system-on-glass" technology by low temperature poly-Si (LTPS) TFTs offer a promising solution because the LTPS allows integration of driving circuit on glass. However, operational amplifiers composed of TFTs have poor performance, such as small gain, large DC offset, high power consumption, slow slew rate, and large area.

FIGS. 2A and 2B show conventional analog buffers comprise N-type source follower or P-type source follower. The output voltage thereof, however, has a DC offset of a $V_{gs}$. FIGS. 3A and 3B show conventional analog buffers comprise a source follower with threshold voltage compensation and $V_{gs}$ compensation. FIG. 3C is a timing chart of the conventional analog buffers shown in FIGS. 3A and 3B. It, however, also has a large DC offset at the output voltage and/or poor driving performance.

SUMMARY

The invention is directed to the broad concept of providing an analog buffer, that stores an input offset voltage, to be used as an output offset voltage, to reverse the offset in the input, so as to obtain a Vout=Vin. In one aspect of the invention, an analog buffer comprises a first source follower at the input end and a second source follower at the output end, both coupled to a switching circuit, wherein the first source follower provides an input offset voltage (e.g., |Vgsp|) based on the input voltage (e.g., Vin), the second source follower provides an output voltage (e.g., Vout) by compensating Vin transmitted through the analog buffer circuit by an output offset voltage (e.g., |Vgsn|), and the switching circuit stores and equalizes the output offset voltage to the input offset voltage (e.g., |Vgsp|=|Vgsn|), so to obtain an output Vout that is identical to Vin.

In another aspect, the present invention discloses embodiments of an analog buffer, in which a first source follower provides a first offset voltage according to an input voltage in a first period, a second source follower provides an output voltage essentially equal to the input voltage in a second period, and a switching circuit coupled to the first source follower and second source follower, which provides a second offset voltage essentially equal to the first offset voltage in a third period intermediate between the first period and second period, wherein the second source follower provides the output voltage based on the second offset voltage.

In a further aspect, the present invention discloses embodiments of an analog buffer, in which a first source follower regulates a first voltage according to an input voltage in a first period, and a switching circuit coupled to the first source follower regulates a second voltage essentially equal to the first voltage, according to the input voltage in a second period. A second source follower is coupled to the switching circuit, receiving the first voltage and the second voltage in the first period and the second period respectively, and outputting the input voltage to a load according thereto in the second period.

In another aspect, the present invention discloses embodiments of a signal driving circuit, in which a digital-to-analog converter (DAC) regulates an analog voltage according to a digital data and an analog buffer as mentioned above, buffering the analog voltage received from the DAC and outputting to a load.

In a further aspect, the present invention discloses embodiments of a display system, in which a signal driving circuit is mentioned above and a display element coupled to the signal driving circuit, wherein the display element is driven by the signal driving circuit.

DESCRIPTION OF THE DRAWINGS

The invention can be more fully understood by the subsequent detailed description and examples with reference made to the accompanying drawings, wherein.

DETAILED DESCRIPTION

First Embodiment

Figure 1:
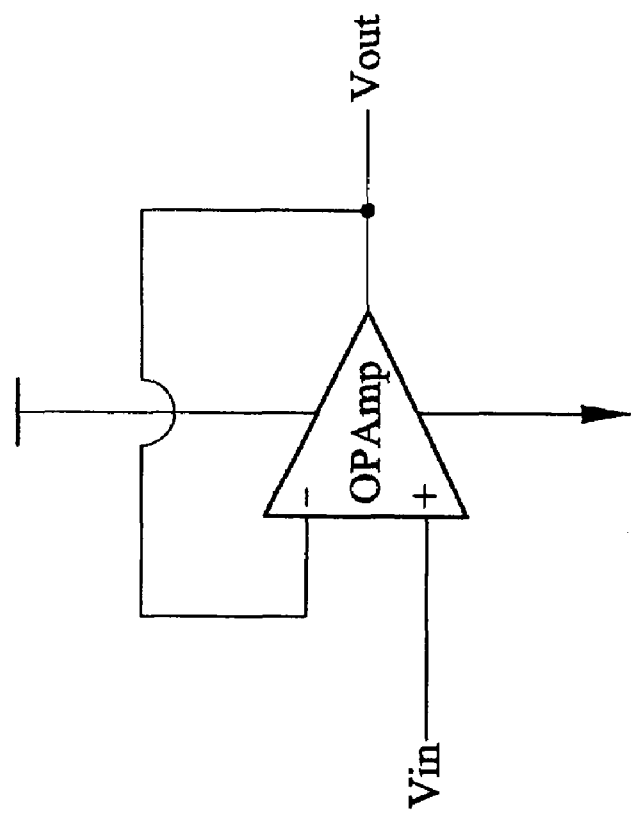
FIG. 1 shows a conventional analog buffer with operational amplifier.
Figure 2B:
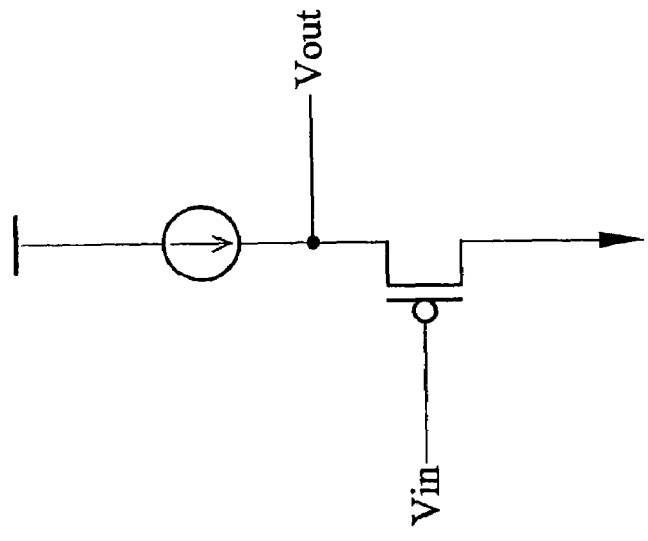
FIG. 2B shows a conventional analog buffer comprising a P-type source follower.
Figure 2A:
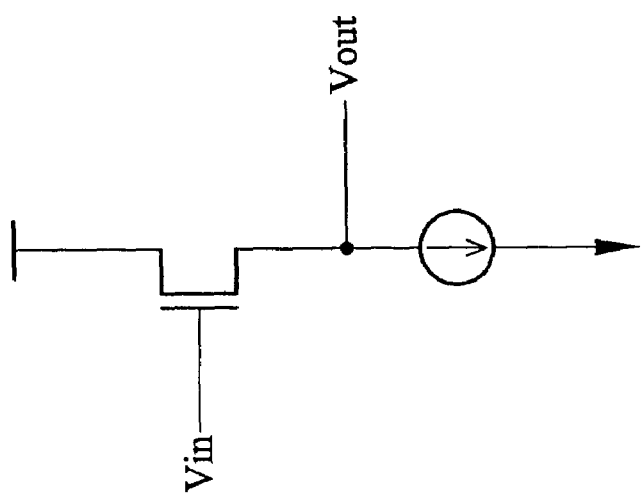
FIG. 2A shows a conventional analog buffer comprising an N-type source follower.
Figure 3A:
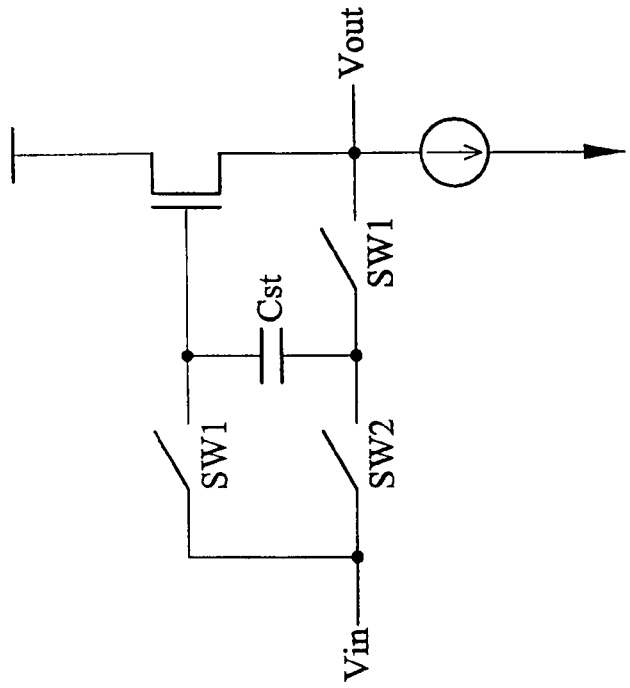
FIGS. 3A and 3B show conventional analog buffers composed by a source follower with threshold voltage compensation and $V_{gs}$ compensation respectively.
Figure 3B:
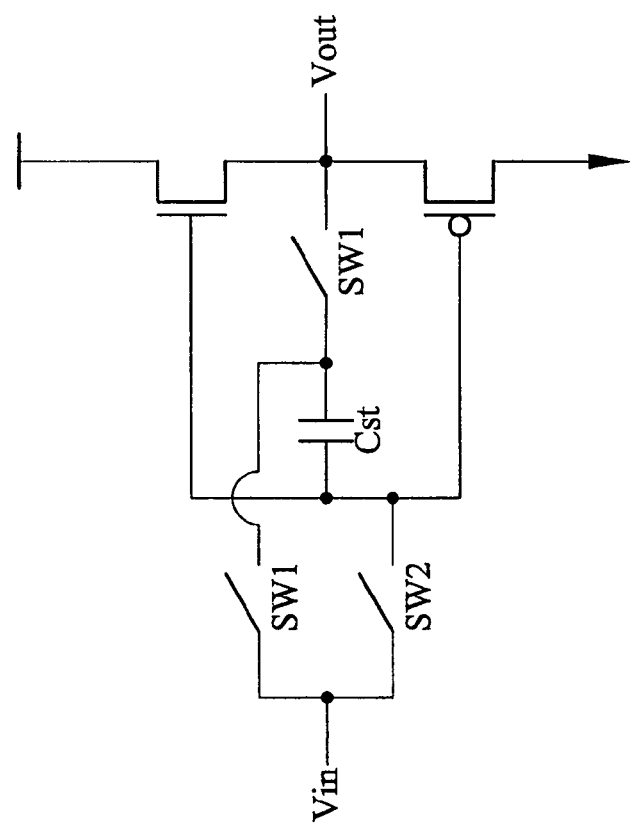
Figure 3C:
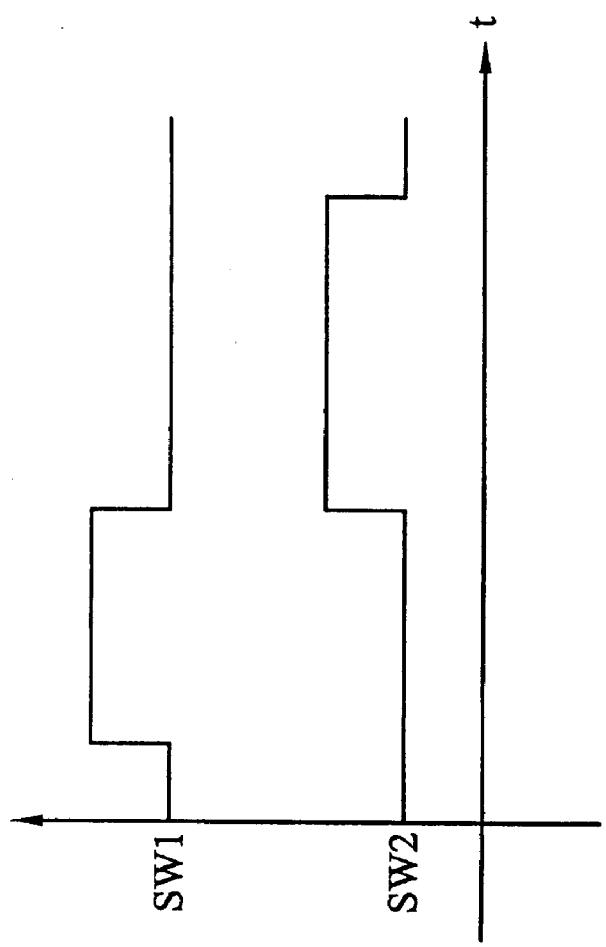
FIG. 3C is a timing chart of the conventional analog buffers shown in FIGS. 3A and 3B.
Figure 4A:
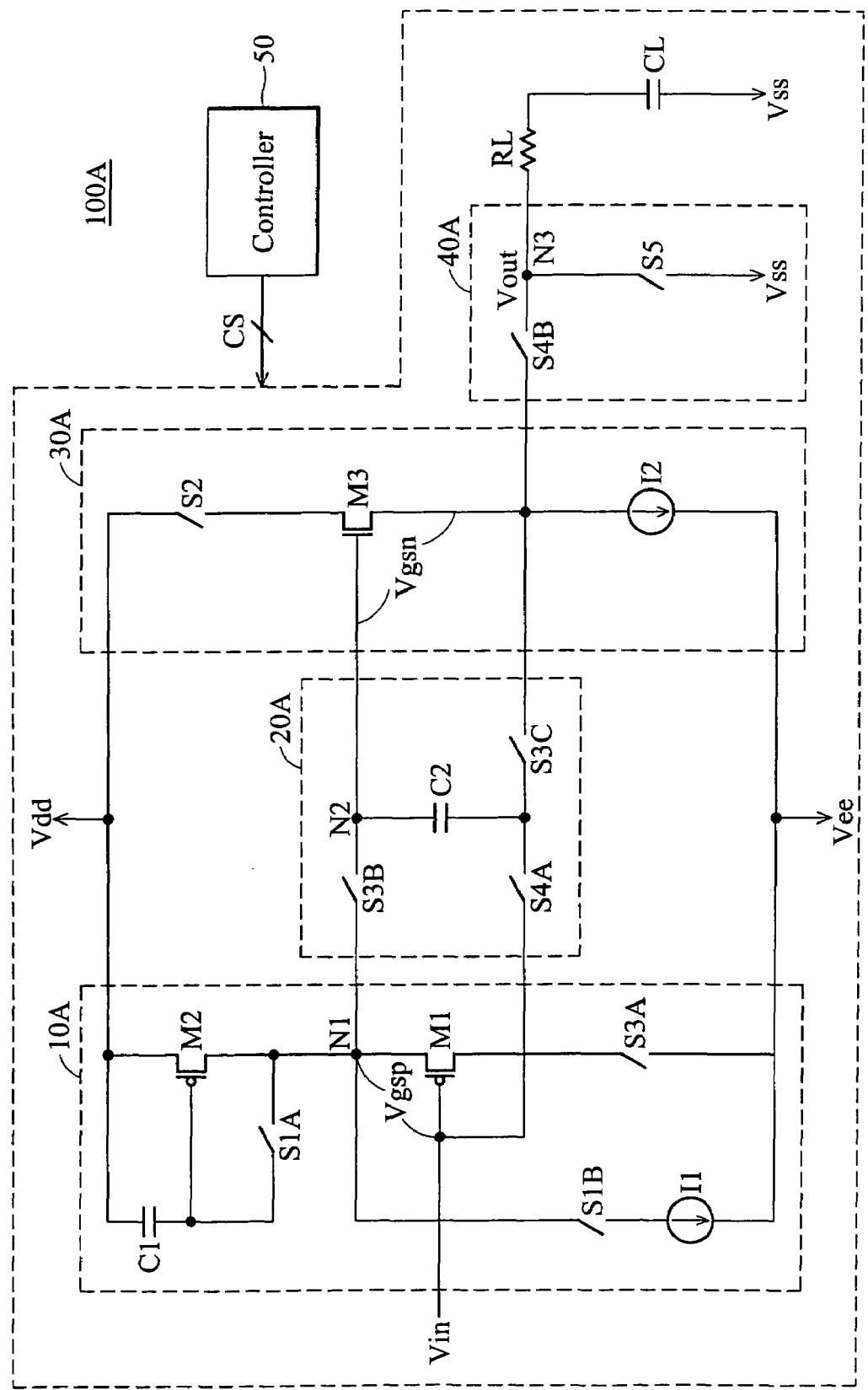
FIG. 4A is a first embodiment of an analog buffer.

FIG. 4A is a first embodiment of an analog buffer in accordance with one aspect of the present invention. The analog buffer 100A comprises a first source follower 10A, a switching circuit 20A, a second source follower 30A, and a discharge circuit 40A.

As shown in FIG. 4A, the first source follower 10A is a P-type source follower coupled between the power voltages Vdd and Vee. The first source follower 10A comprises two transistors M1 and M2, three switching devices S1A, S1B and S3A, a capacitor C1, and a current source I1. The switching circuit 20A is coupled between the first and second source followers 10A and 30A. The switching circuit 20A comprises three switching devices S3B, S3C and S4A and a capacitor C2. The second source follower 30A is an N-type source follower, coupled to the switching circuit 20A. The second source follower 30A comprises a transistor M3, a switching device S2, and a current source I2. The discharge circuit 40A is coupled between the second source follower 30A and a load comprising the resistor RL and the capacitor CL. In this embodiment, the current provided by the current source I2 can be N times that provided by the current source I1, increasing driving capability. A controller 50 controls the switching of the various switches. The controller 50 may be in part of, or the switch control signals CS may be provided by, the timing controller 510 found in the electronic device (see FIG. 10).

Figure 5:
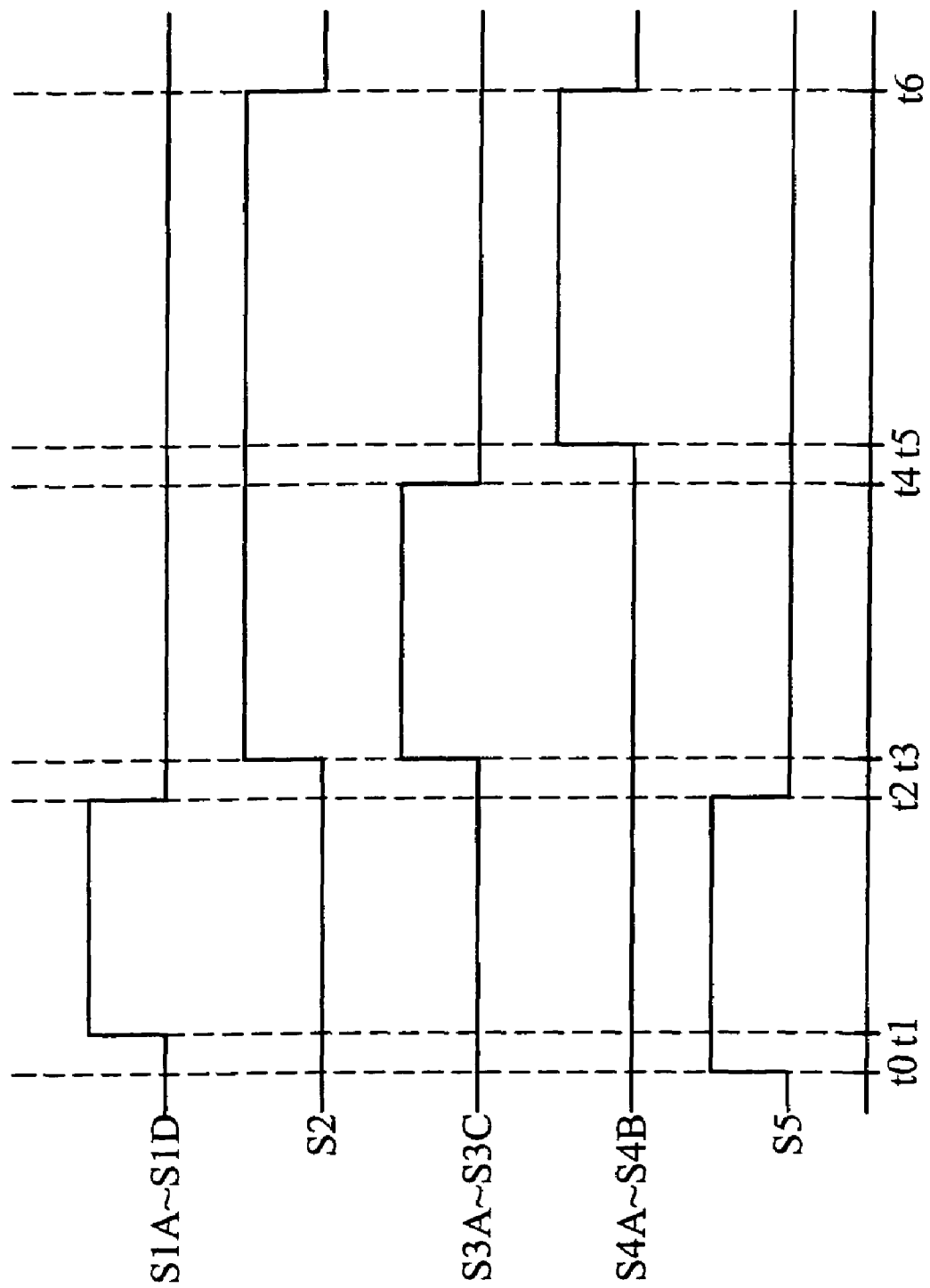
FIG. 5 is a timing chart of the analog buffers according to the embodiments.

FIG. 5 is a timing chart of the analog buffer according to the first embodiment. In time interval t0–t1, all switches are turned off, except that the switching device S5 in the discharge circuit 40A is turned on such that the voltage Vout at the node N3 from a preceding cycle is discharged to the power voltage Vee. In the subsequent time intervals, the various switches are controlled by the controller 50 to function in the manner as described below.

In time interval t1–t2, the switching devices S1A and S1B are turned on such that a voltage is stored in the capacitor C1 to turn on the transistor M2.

In time interval t2–t3, the switching device S5 is turned off. The switching devices S1A and S1B are turned off and the transistor M2 is maintained on due to the voltage stored in the capacitor C1.

In time interval t3–t4, the switching devices S2, S3A, S3B and S3C are turned on such that the first and second source followers 10A and 30A are both enabled. Accordingly, the first source follower 10A regulates a voltage of Vin+|Vgsp| at the node N1. The node N2 is then charged to the voltage of Vin+|Vgsp|, a voltage of |Vgsn| is stored in the capacitor C2. In this embodiment, the $V_{gs}$ of the transistors M1 and M3 are made equal by adjusting M1 and M3 size, namely |Vgsp|=|Vgsn|.

In time interval t4–t5, the switching devices S3A, S3B and S3C are turned off such that the first source follower 10A is disabled to conserve power.

In time interval t5–t6, the switching devices S4A and S4B are turned on and S5 turned off such that the second source follower 30A outputs a voltage Vout identical to the input voltage Vin to load according to the input voltage from the switching devices S4A and the voltage (|Vgsn|) stored capacitor C2. The output voltage Vout regulated by the transistor M3 is identical to the input voltage Vin because the |Vgsn| of the transistor M3 can be compensated by voltage stored in the capacitor C2.

At time t6, the switching devices S2, S4A and S4B are turned off such that the second source follower 30A is disabled to conserve power. The cycle above repeats from t0 to t6, in accordance with the timing chart shown in FIG. 5.

Figure 4B:
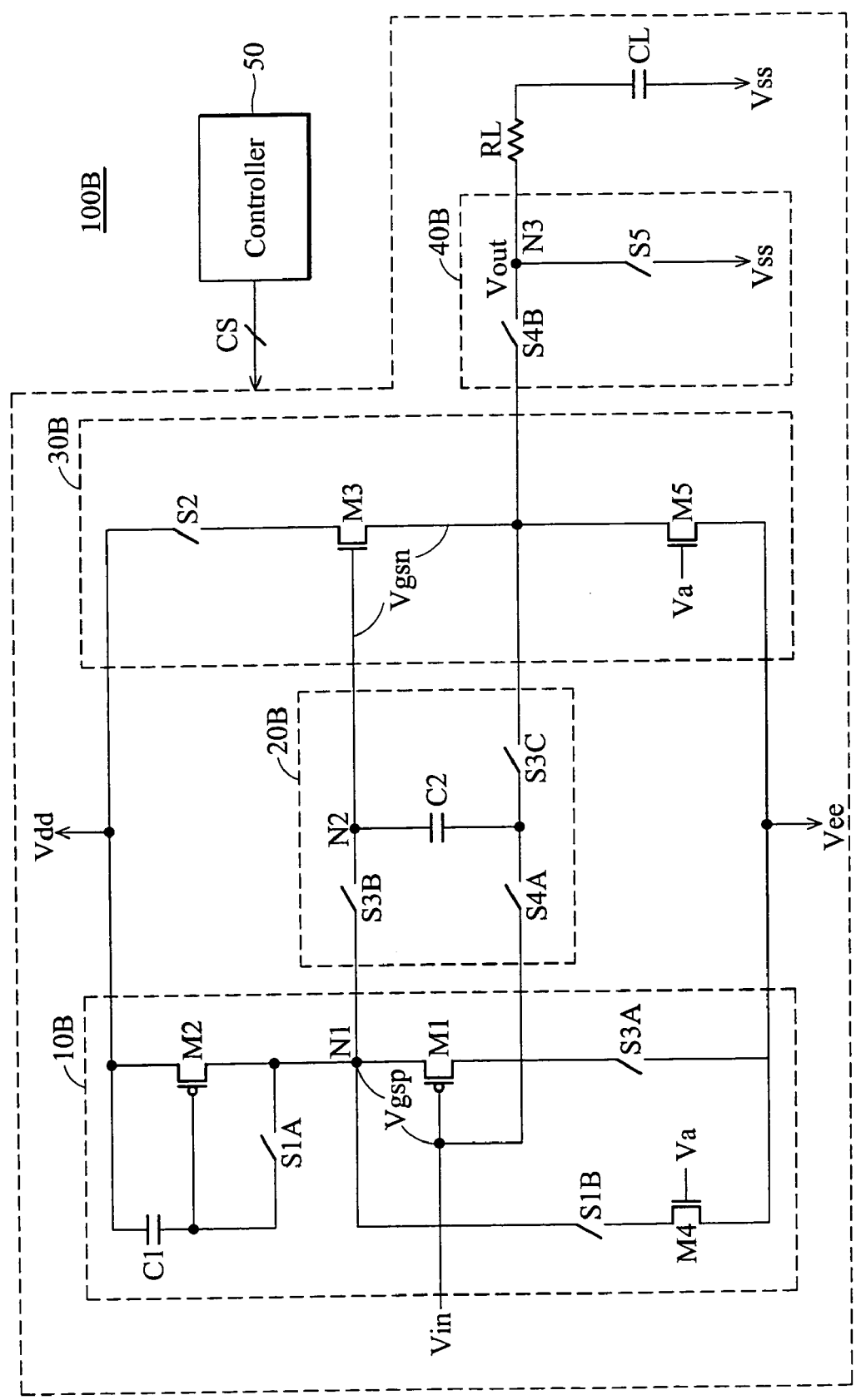
FIG. 4B is another aspect of the first embodiment of the analog buffer.

FIG. 4B is a variation of the first embodiment of an analog buffer. The analog buffer 100B shown in FIG. 4B is similar to the buffer 100A in the FIG. 4A, except that the current sources I1 and I2 are implemented by the transistors M4 and M5 controlled by Va, wherein the transistors M4 and M5 are biased by a bias voltage Va. Operations of the analog buffer 100B shown in FIG. 4B are similar to those shown in FIG. 4A, and thus, are omitted for simplification.

Figure 4C:
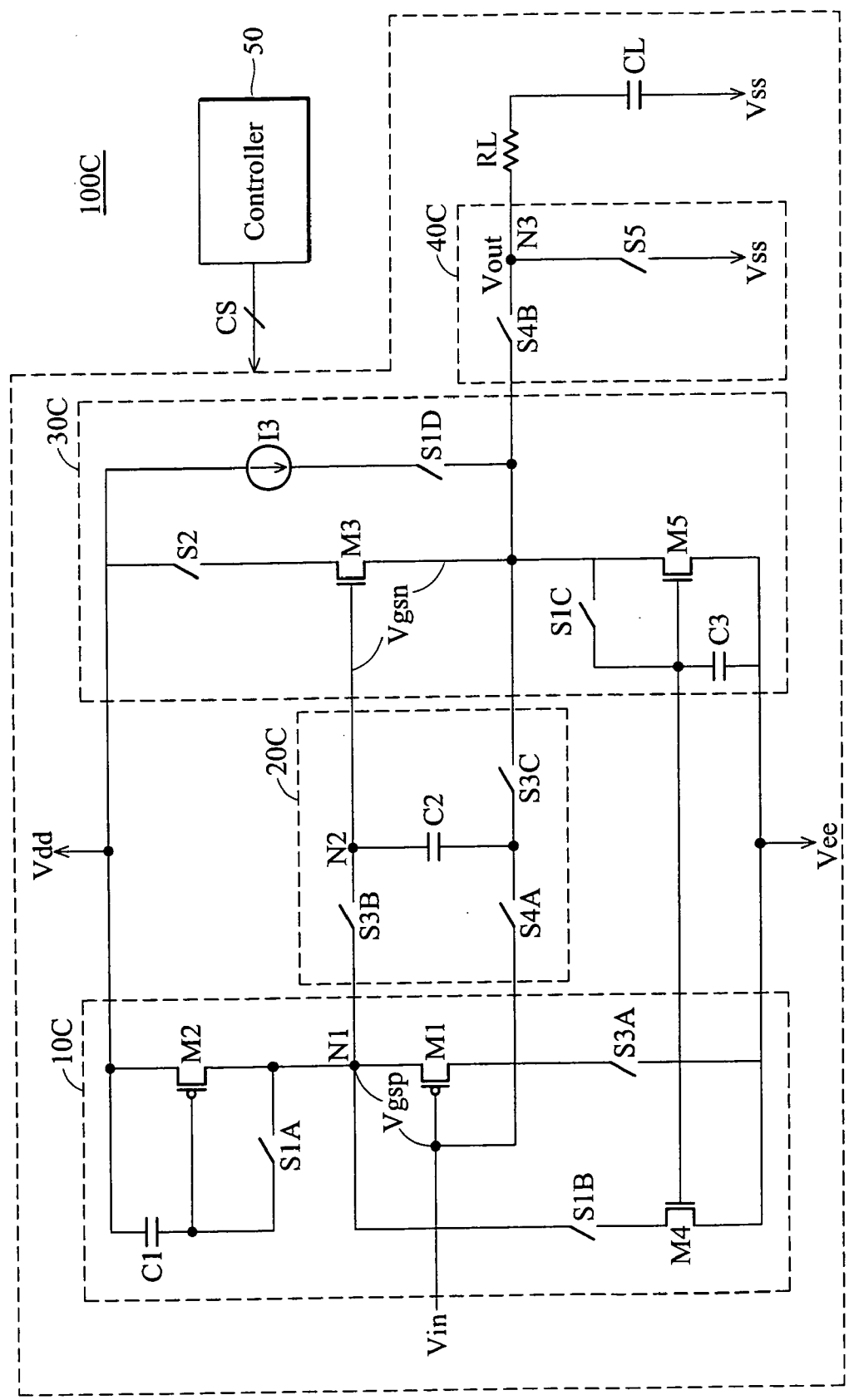
FIG. 4C is also another aspect of the first embodiment of the analog buffer.

FIG. 4C is another variation of the first embodiment of an analog buffer. The analog buffer 100C shown in FIG. 4C is similar to the buffer 100B in the FIG. 4B, except for a bias voltage providing circuit comprising two switching devices S1C and S1D, a capacitor C3 and a current source I3. The switching devices S1C and S1D are also turned on in the time interval t1–t2, such that a bias voltage can be stored in the capacitor C3 to bias the transistors M4 and M5. Operations of the analog buffer 100C shown in FIG. 4C are similar to those shown in FIG. 4A, and thus, are omitted for simplification.

Figure 4D:
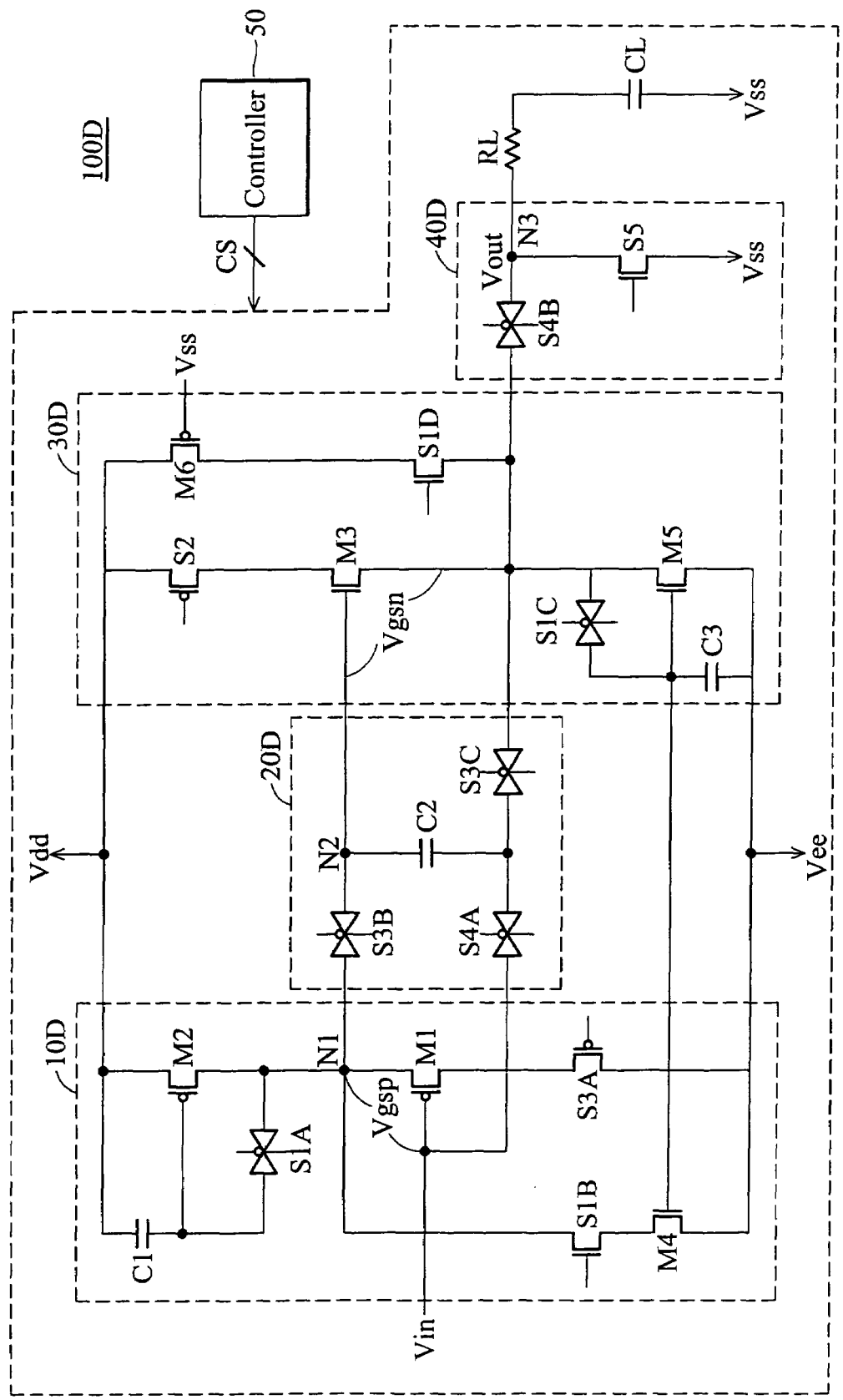
FIG. 4D is still another aspect of the first embodiment of the analog buffer.

FIG. 4D is still another variation of the first embodiment of an analog buffer shown in FIG. 4C. The analog buffer 100D shown in FIG. 4D is similar to the buffer 100C in the FIG. 4C, except that the switching devices S1A, S1C, S3B, S3C, S4B and S4A are implemented by transmission gates, switching devices S1B, S1D, S2, S3A and S5 are implemented by transistors, and the current source I3 is implemented by a P-type transistor M6 with a gate coupled to the power voltage Vss. Operations of the analog buffer 100D shown in FIG. 4D are similar to those shown in FIG. 4A, and thus, are omitted for simplification.

Second Embodiment

Figure 6A:
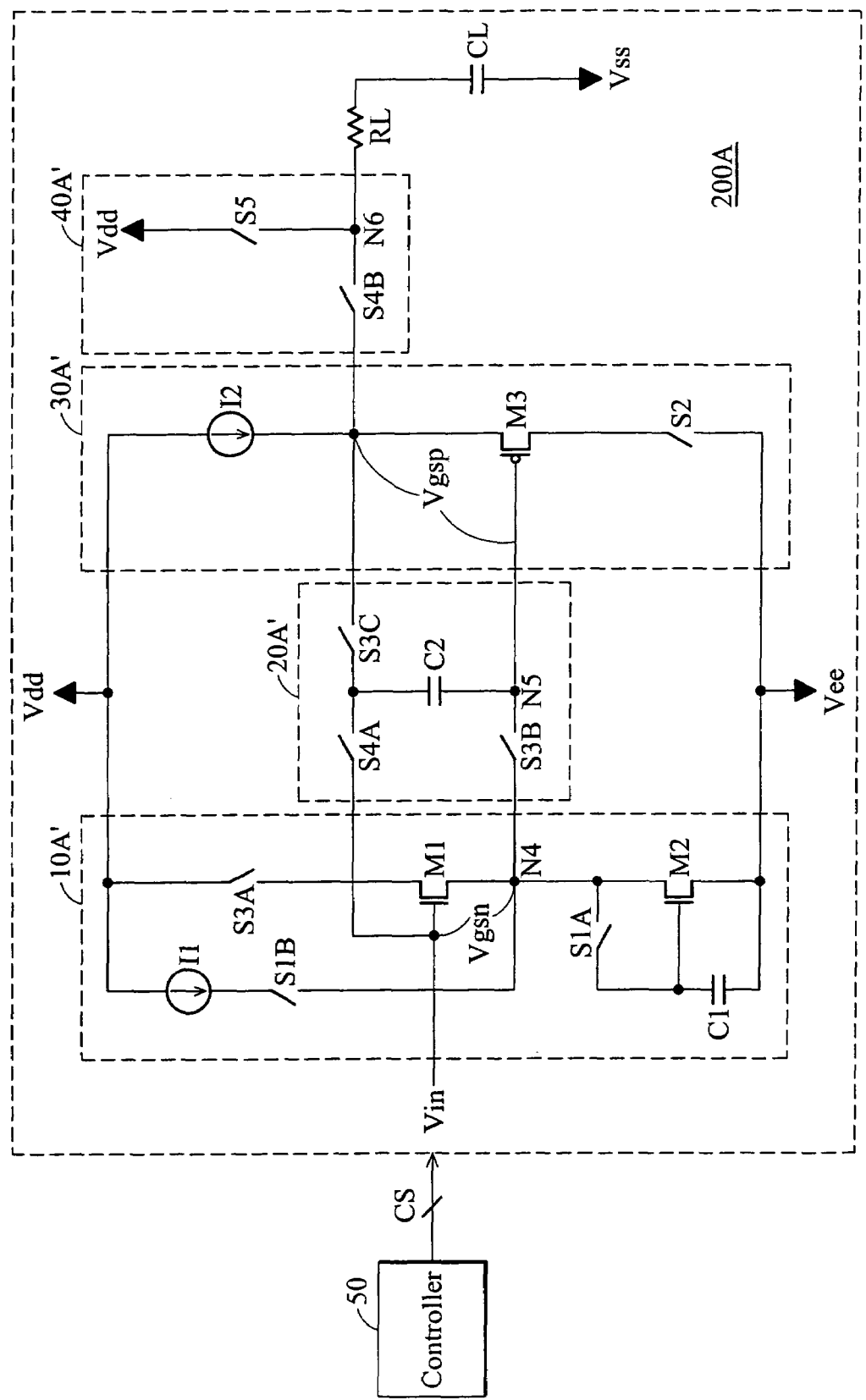
FIG. 6A is a second embodiment of an analog buffer.

FIG. 6A is a second embodiment of an analog buffer. The analog buffer 200A comprises a first source follower 10A', a switching circuit 20A', a second source follower 30A', and a pre-charge circuit 40A'. As shown in FIG. 6A, unlike the first embodiment, the first source follower 10A' is an N-type source follower coupled between the power voltages Vdd and Vee. The second source follower 30A' is a P-type source follower, coupled to the switching circuit 20A'.

The first source follower 10A' comprises two transistors M1 and M2, three switching devices S1A, S1B and S3A, a capacitor C1, and a current source I1. The switching circuit 20A' is coupled between the first and second source followers 10A' and 30A'. The switching circuit 20 comprises three switching devices S3B, S3C and S4A and a capacitor C2. The second source follower 30A' is a P-type source follower, coupled to the switching circuit 20A'. The second source follower 30A' comprises a transistor M3, a switching device S2, and a current source I2. The pre-charge circuit 40A' is coupled between the second source follower 30 and a load comprising the resistor RL and the capacitor CL. In this embodiment, the current provided by the current source I2 can be N times that provided by the current source I1, for increased driving capability.

FIG. 5 is also the timing chart of the analog buffer according to the second embodiment. In time interval t0–t1, the switching device S5 in the charge circuit 40A' is turned on such that the voltage Vout at the node N6 is charged to the power voltage Vdd.

In time interval t1–t2, the switching devices S1A and S1B are turned on such that a voltage is stored in the capacitor C1 to turn on the transistor M2.

In time interval t2–t3, the switching device S5 is turned off. The switching devices S1A and S1B are turned off and the transistor M2 is maintained on due to the voltage stored in the capacitor C1.

In time interval t3–t4, the switching devices S2, S3A, S3B and S3C are turned on such that the first and second source followers 10A' and 30A' are both enabled. Accordingly, the first source follower 10A' regulates a voltage of Vin–|Vgsn| at the node N4. The node N5 is then charged to the voltage of Vin–|Vgsn| due to turning on of the switching device S3B, and a voltage of |Vgsp| is stored in the capacitor C2. In this embodiment, the $V_{gs}$ of the transistors M1 and M3 are made equal by adjusting M1 and M3 size, namely |Vgsp|=|Vgsn|.

In time interval t4–t5, the switching devices S3A, S3B and S3C are turned off such that the first source follower 10A' is disabled to conserve power.

In time interval t5–t6, the switching devices S4A and S4B are turned on such that the second source follower 30A' outputs an output voltage Vout identical to the input voltage Vin to load according to the input voltage from the switching devices S4A and the voltage stored capacitor C2. The output voltage Vout regulated by the transistor M3 is identical to the input voltage Vin because the |Vgsp| of the transistor M3 can be compensated by voltage stored in the capacitor C2.

At time t6, the switching devices S2, S4A and S4B are turned off such that the second source follower 30A' is disabled to conserve power.

Figure 6B:
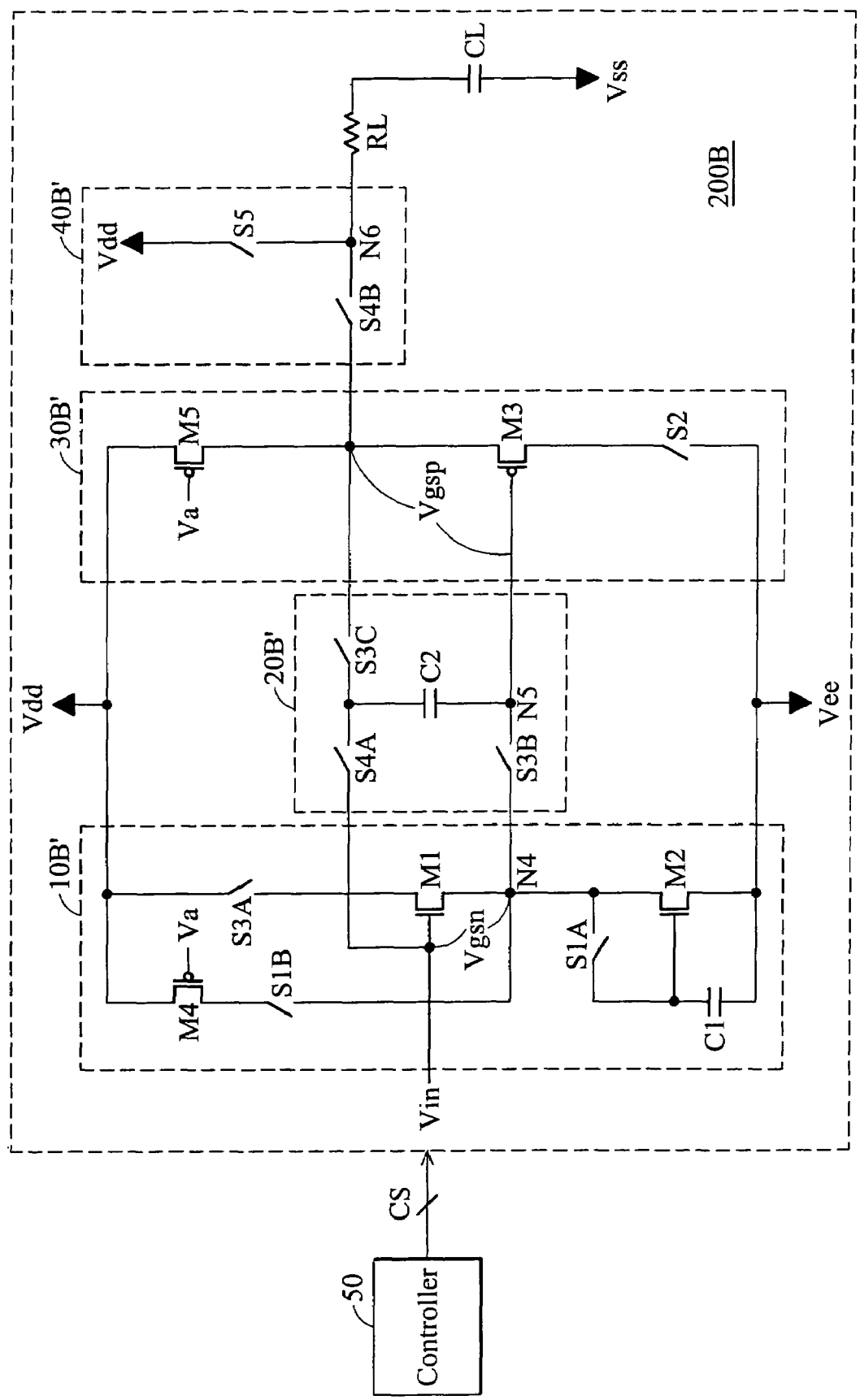
FIG. 6B is another aspect of the second embodiment of the analog buffer.

FIG. 6B is a variation of the second embodiment of an analog buffer. The analog buffer 200B shown in FIG. 6B is similar to the buffer 200A in the FIG. 6A, except that the current sources I1 and I2 are implemented by the transistors M4 and M5, wherein the transistors M4 and M5 are biased by a bias voltage Va. Operations of the analog buffer 200B shown in FIG. 6B are similar to those shown in FIG. 6A, and thus, are omitted for simplification.

Figure 6C:
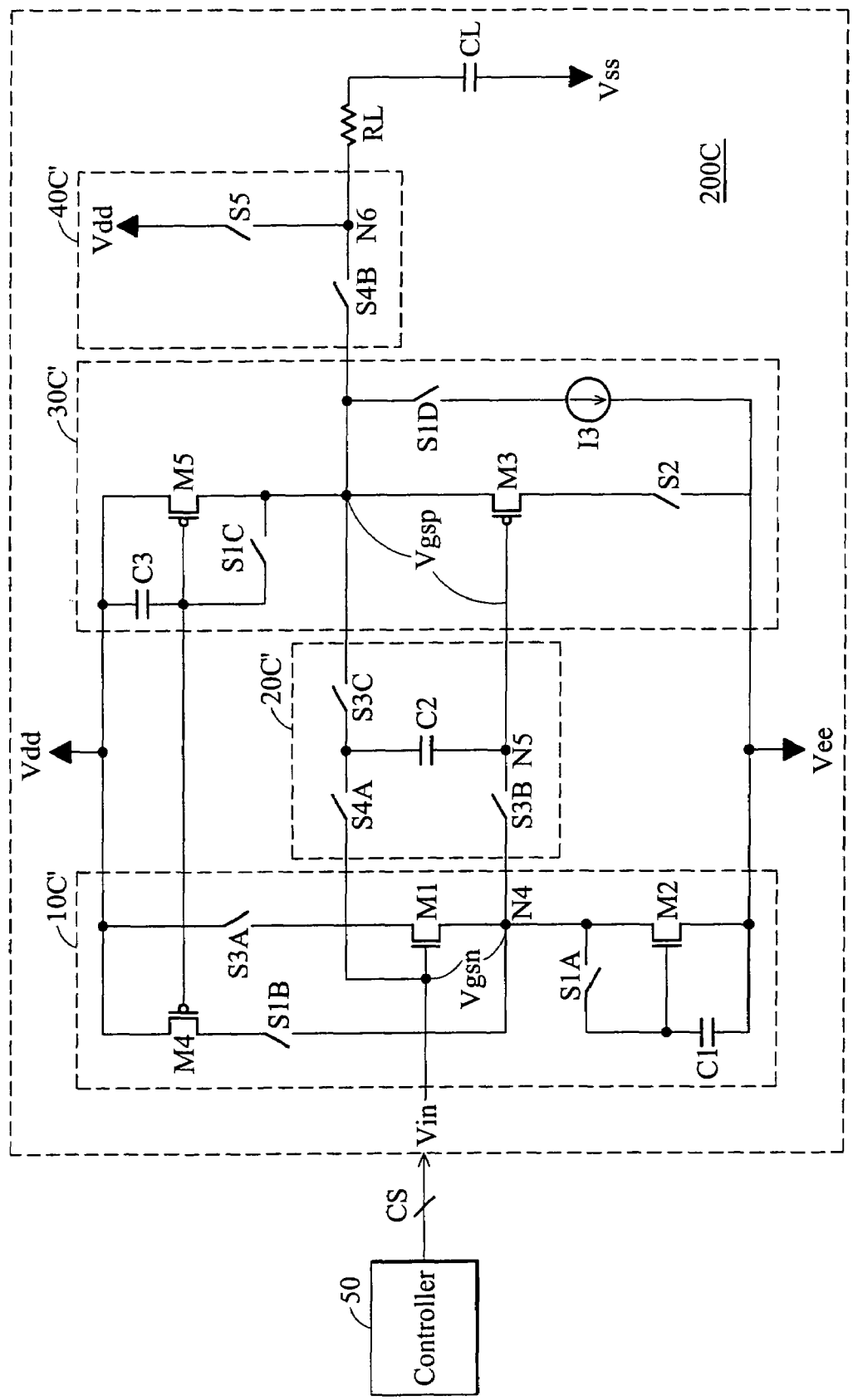
FIG. 6C is also another aspect of the second embodiment of the analog buffer.

FIG. 6C is also another aspect of the second embodiment of an analog buffer. The analog buffer 200C shown in FIG. 6C is similar to the buffer 200B in the FIG. 6B, except for a bias voltage providing circuit comprising two switching devices S1C and S1D, a capacitor C3 and a current source I3. The switching devices S1C and S1D are also turned on in the time interval t1–t2, such that a bias voltage can be stored in the capacitor C3. Operations of the analog buffer 200C shown in FIG. 6C are similar to those shown in FIG. 6A, and thus, are omitted for simplification.

Figure 6D:
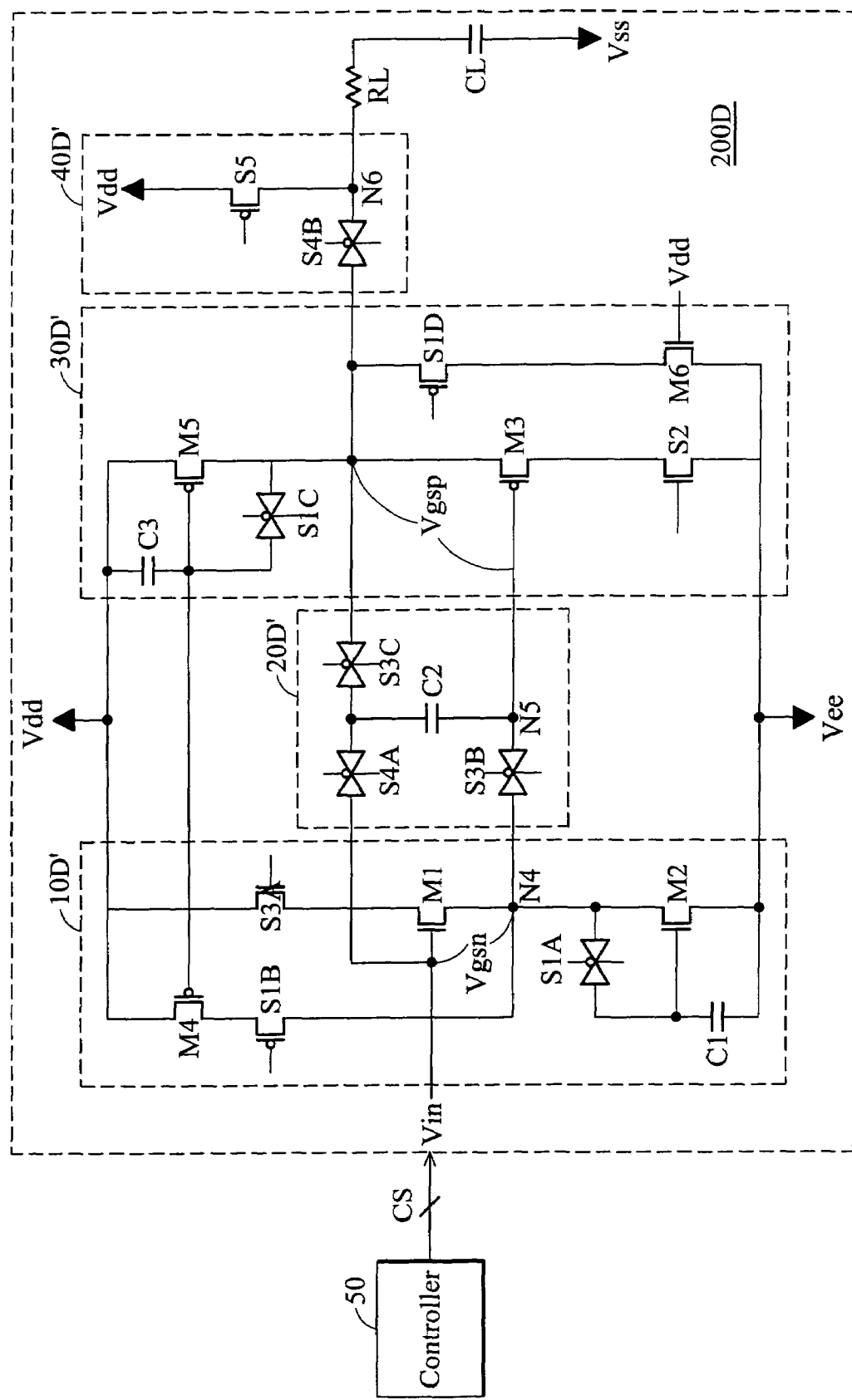
FIG. 6D is still another aspect of the second embodiment of the analog buffer.

FIG. 6D is still another aspect of the first embodiment of an analog buffer. The analog buffer 200D shown in FIG. 6D is similar to the buffer 600C in the FIG. 6C, except that the switching devices S1A, S1C, S3B, S3C, S4B and S4A are implemented by transmitting gates, S1B, S1D, S2, S3A and S5 are implemented by transistors, and the current source I3 is implemented by an N-type transistor with a gate coupled to the power voltage Vdd. Operations of the analog buffer 200D shown in FIG. 6D are similar to those shown in FIG. 6A, and thus, are omitted for simplification.

Figure 7:
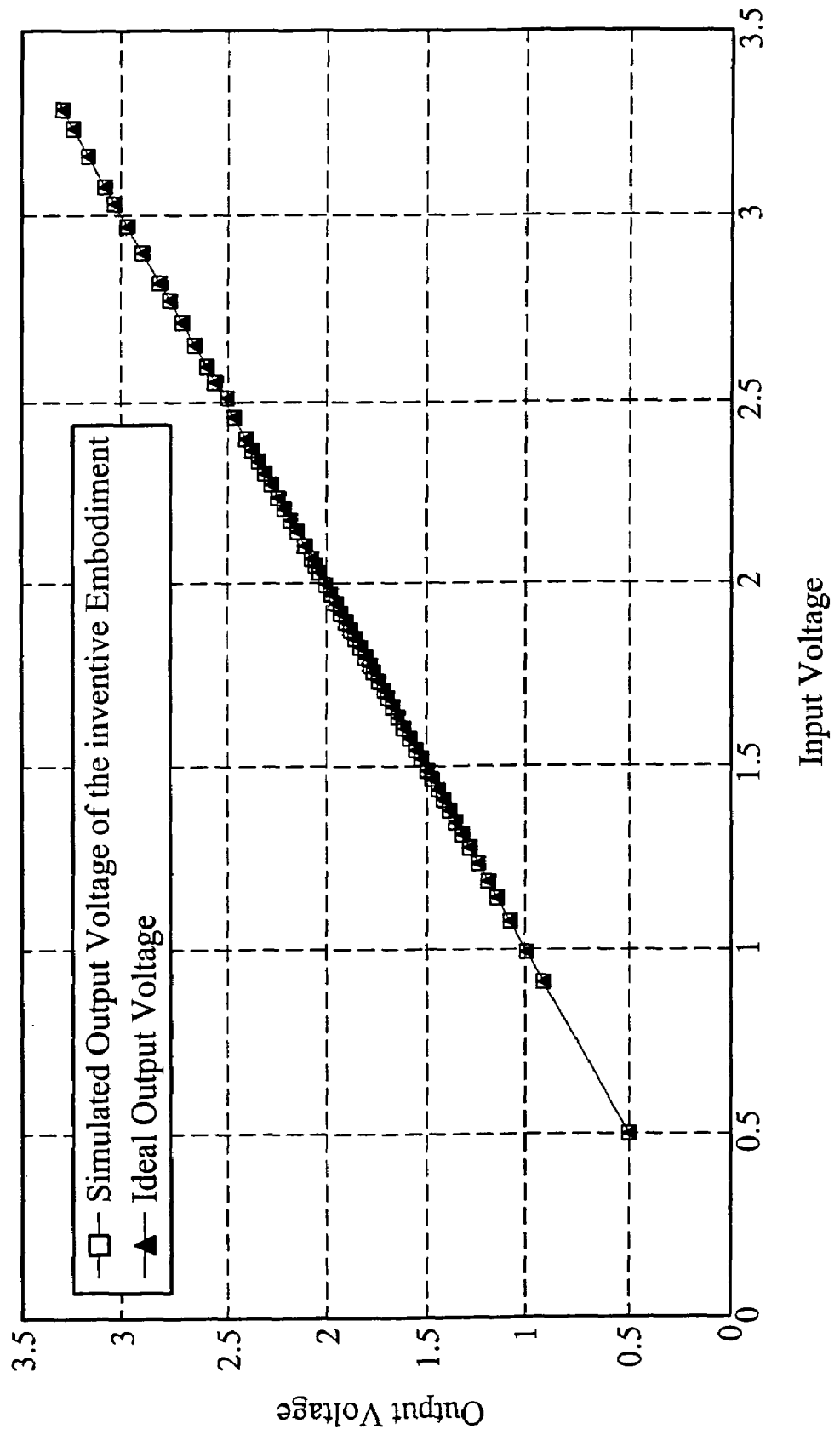
FIG. 7 shows the relationship between the input voltage and output voltage of the analog buffer according to simulation of the embodiment of FIG. 4B.
Figure 8:
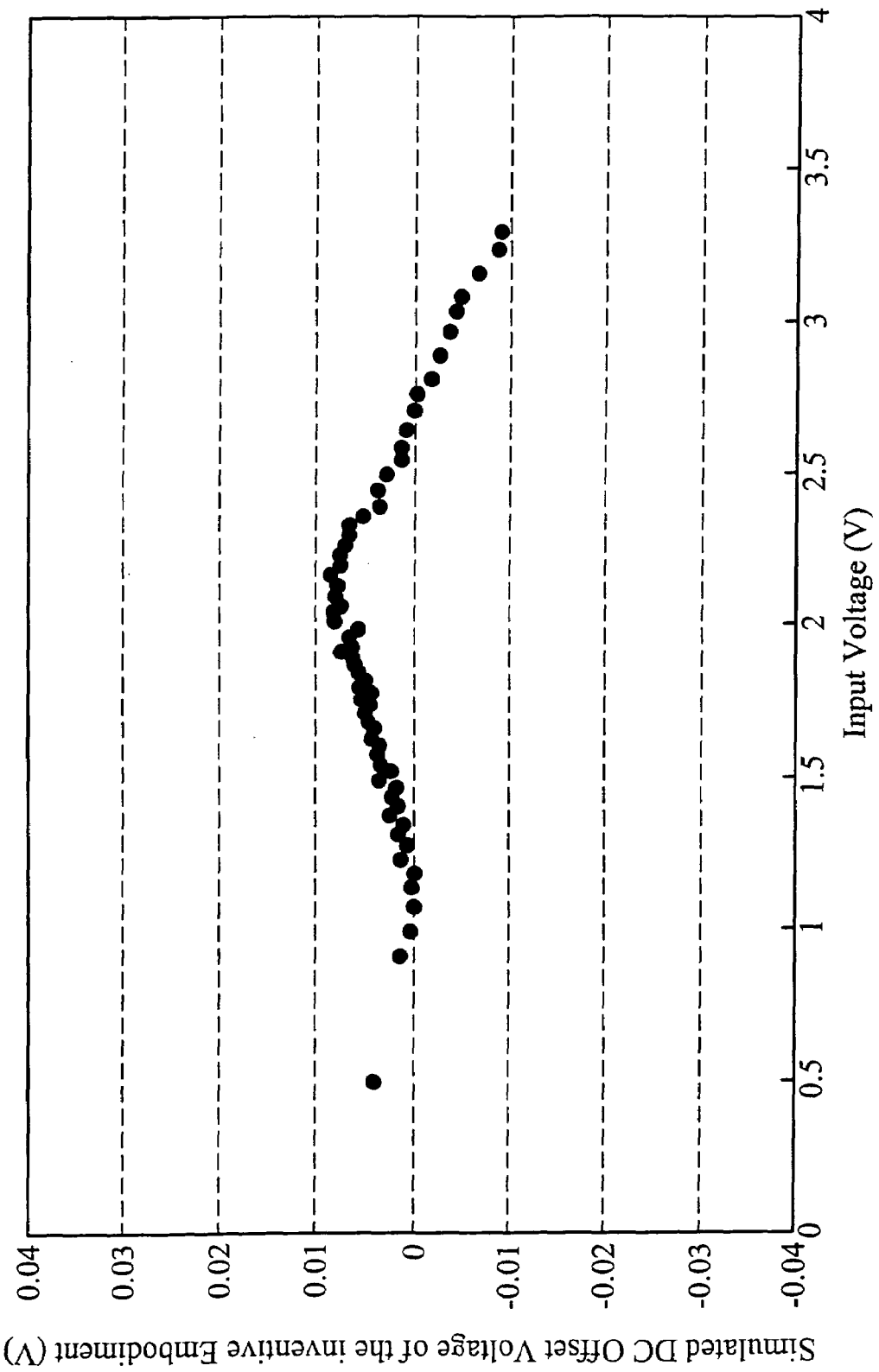
FIG. 8 shows the relationship between the input voltage and DC offset voltage of the analog buffer according to simulation of the embodiment of FIG. 4B.

FIG. 7 shows the relationship of the input voltage and output voltage of the analog buffer according to simulation of the embodiment of FIG. 4B. As shown, output voltages of the analog buffer are extremely close to input voltage thereof. FIG. 8 shows the relationship between the input voltage and DC offset voltage of the analog buffer according to simulation of the embodiment of FIG. 4B. As shown in FIG. 8, the DC offset voltage of the analog buffers of the embodiments is less than 10 mV. In addition, reasonable driving capability is provided.

Because the analog buffers of the embodiment of the invention require only a first source follower, a switching circuit, a second source follower and a discharge circuit, they have simpler circuit structure and small layout area than those with operational amplifiers. Further, in the embodiments, the first and second source followers are not turned on all the time, and thus, the analog buffers also converse power.

Figures 9, 10:
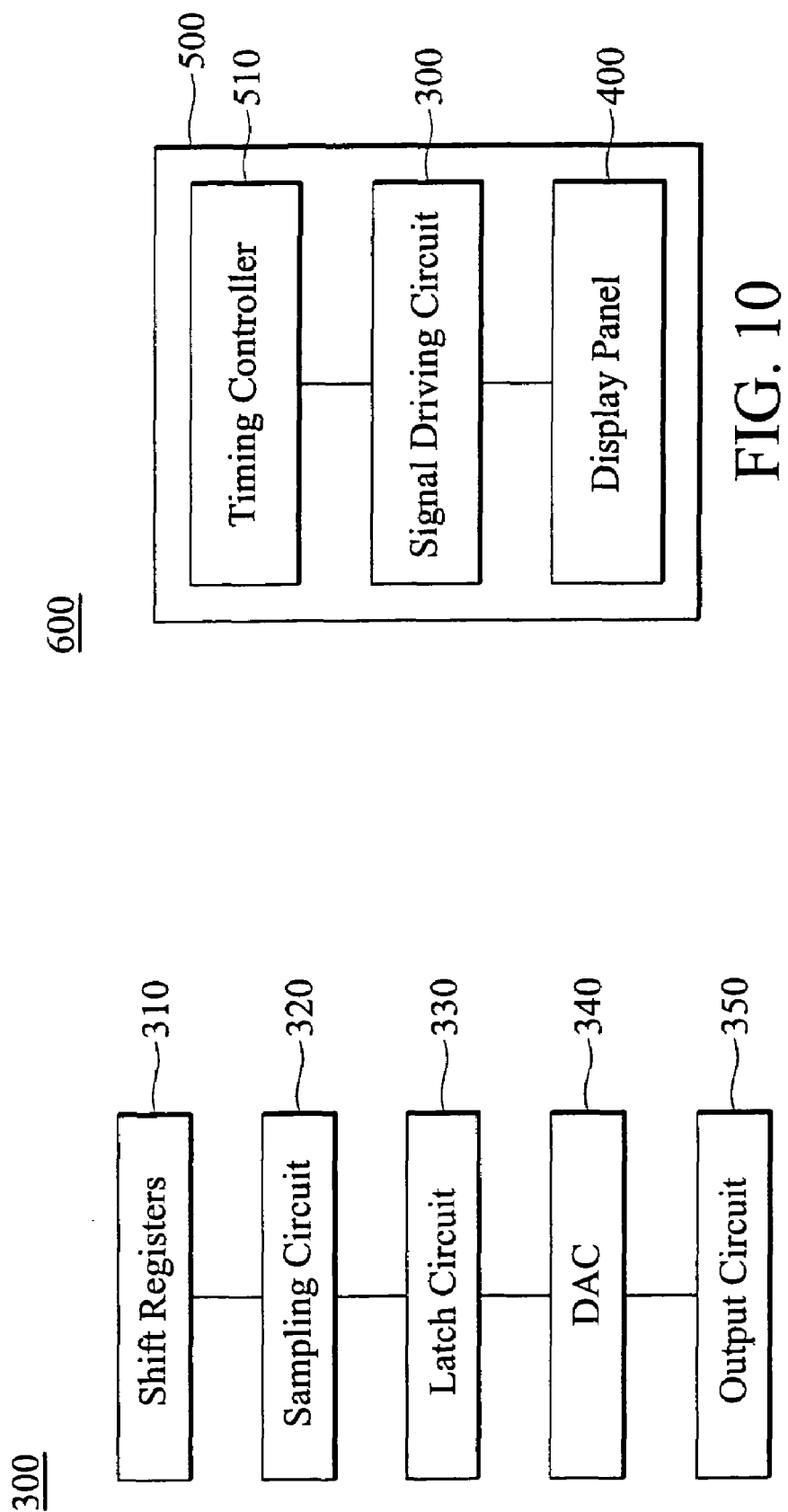
FIG. 9 is a schematic diagram of a signal driving circuit according to various embodiments of the invention.
FIG. 10 schematically shows an electronic device deploying a driving circuit shown in FIG. 9.

FIG. 9 is a schematic diagram of a signal driving circuit 300 according to various embodiments of the invention. As shown in FIG. 9, signal driving circuit 300 can comprise shift registers 310, a sampling circuit 320, a latching circuit 330, a digital-to-analog converter (DAC) 340, and an output circuit 350 comprising analog buffers as shown in FIGS. 4A–4D or 6A–6D. The shift registers 310 have a plurality of stages equal in number to columns of pixels in a display panel (not shown). The sampling circuit 320 samples data on a data bus (not shown) synchronous with sampling pulses output successively from the shift registers 310. The latch circuit 330 holds and latches the sampled data during a horizontal period, and the DAC 340 converts the latched data to analog signals. The output circuit 350 drives the columns of pixels in a display panel according to the analog signals from the digital-to-analog converter (DAC) circuit 340 and control signals from external controller.

FIG. 10 schematically shows an electronic device 600 deploying a driving circuit 300 described above. The display panel 400 can be a liquid crystal display device. The electronic device 500 may be a portable device such as a PDA, notebook computer, tablet computer, cellular phone, or a display monitor device, etc. Generally, the electronic device 600 includes a housing 500, a timing controller 510, the display panel 400 and a driving circuit 300, etc. Further, the timing controller 510 is operatively coupled to the signal driving circuit and provides control signals to the driving circuit 300. The driving circuit 300 is operatively coupled to the display panel 400 and provides analog voltage to drive the display panel 400, and the display panel 400 displays images.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An analog buffer, comprising:
   a first source follower, regulating a first voltage according to an input voltage during a first period;
   a switching circuit coupled to the first source follower, regulating a second voltage essentially equal to the first voltage during a second period;
   a second source follower coupled to the switching circuit, receiving the first voltage and the second voltage during the first period and the second period respectively, and outputting a voltage corresponding to the input voltage to a load according thereto during the second period; and
   a pre-charge/discharge circuit coupled between the second source follower and the load for pre-charge/discharge in a third period.

2. The analog buffer as claimed in claim 1, wherein the first source follower comprises a first switching device of a first conductive type with a first gate to source voltage, and the second source follower comprises a second switching device of a second conductive type with a second gate to source voltage essentially equal to the first gate to source voltage.

3. The analog buffer as claimed in claim 1, wherein the first source follower is an N-type source follower and the second source follower is a P-type source follower.

4. The analog buffer as claimed in claim 1, wherein the first source follower is a P-type source follower and the second source follower is an N-type source follower.

5. The analog buffer as claimed in claim 1, wherein the first source follower is turned off and the second source follower turned on during the second period, and the first source follower and the second source follower are turned off in the third period.

6. The analog buffer as claimed in claim 1, wherein the first source follower and the second source follower are turned on to store the second voltage in the switching circuit, during the first period.

7. The analog buffer as claimed in claim 6, wherein the the second voltage essentially equal to the second gate source voltage.

8. The analog buffer as claimed in claim 1, wherein the first source follower comprises:
a first switching device of a first conductive type, with a first gate to source voltage, comprising a control terminal coupled to the input voltage and a first terminal and a second terminal; and
a second switching device of the first conductive type coupled between the first terminal of the first switching device and a first power voltage.

9. The analog buffer as claimed in claim 8, wherein the second source follower comprises:
a third switching device of a second conductive type, with a second gate to source voltage, and comprising a control terminal receiving the first voltage and the second voltage, a first terminal coupled to the load and a second terminal, wherein the second gate to source voltage essentially equals the first gate to source voltage; and
a fourth switching device coupled between the second terminal of the third switching device and a second power voltage.

10. The analog buffer as claimed in claim 9, wherein the switching circuit comprises:
a fifth switching device coupled between the second terminal of the first switching device and the control terminal of the third switching device;
a first capacitor comprising a first terminal coupled to the control terminal of the third switching device and a second terminal;
a sixth switching device coupled between the input voltage and the second terminal of the first capacitor; and
a seventh switching device coupled between the second terminal of the first capacitor and the load.

11. The analog buffer as claimed in claim 8, wherein the first source follower further comprises a first current source coupled to a second terminal of the first switching device.

12. The analog buffer as claimed in claim 8, wherein the second source follower further comprises a second current source coupled to a first terminal of the third switching device.

13. The analog buffer as claimed in claim 10, wherein the first to seventh switching devices are thin film transistors.

14. The analog buffer as claimed in claim 10, wherein the fifth, sixth and seventh switching device are transmission gates.

15. A signal driving circuit, comprising:
a digital-to-analog converter (DAC), generating an analog voltage according a digital data; and
an analog buffer as claimed in claim 1, buffering the analog voltage from receiving the DAC and outputting to a load.

16. An electronic device, comprising:
a signal driving circuit as claimed in claim 15; and
a display element coupled to the signal driving circuit, wherein the display element is driven by the signal driving circuit.

17. The electronic device as claimed in claim 16, wherein the display element is at least one of a liquid crystal display element, a plasma display element, an organic light emitting display element, and a cathode ray tube element.

18. The electronic device as claimed in claim 17, wherein the electronic device is at least one of a PDA, a display monitor, a notebook computer, a tablet computer, or a cellular phone.

19. An analog buffer, comprising:
a first source follower, the first source follower receiving an input voltage to generate a first voltage having an absolute value exceeding that of the input voltage during a first period;
a second source follower comprising an MOS transistor having a gate and a source; and
a switching circuit coupled between the first source follower and the second source follower, the switching circuit charged by the first voltage during the first period to store a voltage difference between the gate and the source of the MOS transistor in the second source follower, wherein the voltage difference corresponds to the absolute value,
wherein during a second period, the second source follower receives a second voltage combining the stored voltage difference and the input voltage, and compensates the second voltage to remove the voltage difference, to generate an output voltage substantial identical to the input voltage during the second period.

20. An analog buffer, comprising:
a first source follower having a first offset voltage, the first source follower receiving an input voltage to generate a first voltage corresponding to the input voltage with the first offset voltage;
a second source follower having a second offset voltage corresponding to the first offset voltage; and
a switching circuit coupled between the first source follower and the second follower, the switch circuit storing a voltage corresponding to the second offset voltage during the first period,
wherein the second source follower receives during a second period a combined voltage corresponding to the input voltage and the stored voltage, and wherein the combined voltage is compensated by the second offset voltage of the second source follower, to generate an output voltage substantially identical to the input voltage.

21. A method of regulating voltage in an analog buffer, comprising:
providing a first source follower and a second source follower;
generating a first voltage with the first source follower, corresponding to an input voltage with a first offset voltage of the first source follower;

storing a voltage corresponding to a second offset voltage of the second source follower;

providing to the second source follower a combined voltage corresponding to the input voltage and the stored voltage;

compensating the combined voltage by the second offset voltage of the second source follower, thereby generating an output voltage substantially identical to the input voltage.

* * * * *